United States Patent [19]

Lindmayer

[11] Patent Number: 4,915,982

[45] Date of Patent: * Apr. 10, 1990

[54] METHOD OF MAKING THIN FILM PHOTOLUMINESCENT ARTICLES

[75] Inventor: Joseph Lindmayer, Potomac, Md.

[73] Assignee: Quantex Corporation, Rockville, Md.

[*] Notice: The portion of the term of this patent subsequent to May 16, 2006 has been disclaimed.

[21] Appl. No.: 184,263

[22] Filed: Apr. 21, 1988

Related U.S. Application Data

[63] Continuation-in-part of Ser. No. 870,809, Jun. 5, 1986, Pat. No. 4,830,875, and a continuation-in-part of Ser. No. 870,877, Jun. 5, 1986, Pat. No. 4,864,536, Continuation-in-part of Ser. No. 786,095, Oct. 10, 1985, Pat. No. 4,705,952.

[51] Int. Cl.$^4$ .......................... B05D 5/06; B05D 5/12
[52] U.S. Cl. ........................................ 427/69; 427/64; 427/66
[58] Field of Search ............... 427/64, 66, 69, 71; 252/301.4 S, 301.6 S, 301.4 H; 250/372.2 A–372.2 E, 484.1, 486.1

[56] References Cited

U.S. PATENT DOCUMENTS

| | | | |
|---|---|---|---|
| Re. 31,847 | 3/1985 | Luckey | 250/327.2 A |
| 2,468,452 | 4/1949 | Leverenz | 252/301.4 S |
| 2,468,714 | 4/1949 | Leverenz | 252/301.4 S |
| 2,485,903 | 10/1949 | Miller | 252/301.4 S |
| 2,521,124 | 9/1950 | Miller | 252/301.4 S |
| 2,522,074 | 9/1950 | Urbach | 252/301.4 S |
| 2,523,306 | 9/1950 | Kaiser et al. | 250/327.2 A |
| 2,527,365 | 10/1950 | Leverenz | 252/301.4 S |
| 2,979,467 | 4/1961 | Keller | 252/301.4 S |
| 3,347,693 | 10/1967 | Wendland | 427/69 |
| 3,700,479 | 10/1972 | Arents | 427/64 |
| 3,894,164 | 7/1975 | Dismukes et al. | 427/64 |
| 4,348,299 | 9/1982 | Okamoto et al. | 252/301.4 S |
| 4,507,562 | 3/1985 | Gasiot et al. | 250/484.1 B |
| 4,510,388 | 4/1985 | Yamazaki et al. | 250/327.2 A |
| 4,705,952 | 11/1987 | Lindmayer | 250/484.1 B |
| 4,725,344 | 2/1988 | Yocom et al. | 427/64 |
| 4,741,993 | 5/1988 | Kano et al. | 250/484.1 B |
| 4,769,549 | 9/1988 | Tsuchino et al. | 250/484.1 B |
| 4,830,875 | 5/1989 | Lindmayer | 427/69 |

FOREIGN PATENT DOCUMENTS

| | | | |
|---|---|---|---|
| 599073 | 5/1960 | Canada | 427/69 |
| 8500089 | 4/1985 | PCT Int'l Appl. | |

OTHER PUBLICATIONS

Keller, et al., "Studies on Some IR Stimulatable Phosphors", *Phys. Rev.*, vol. 108, #3, Nov. 1, 1957, pp. 663–676.

J. Lindmayer, "IR Phosphors as Sensors", *Sensors*, 3/86.

Mims, "How to See Near IR Radiation", *Modern Electronics*, 5/85, pp. 64–70.

*Vapor Deposition*, ed. Powell et al.; J. Wiley & Sons, Inc., N.Y., May 4, 1972, pp. 569–570.

Primary Examiner—Norman Morgenstern
Assistant Examiner—Marianne L. Padgett
Attorney, Agent, or Firm—Ostrolenk, Faber, Gerb & Soffen

[57] ABSTRACT

An article, having particular use as an optical memory medium, includes a thin electron trapping photoluminescent film upon a substrate. In one preferred embodiment, a selected material is prepared in bulk, then applied in a relatively thin film to a substrate, and then heated to a sufficient temperature for a sufficient period of time such that the selected material acquires electron trapping characteristics and becomes photoluminescent. Some preferred methods of depositing the material are electron-beam deposition and sputtering. Some preferred methods of heating the material include photo crystallization and laser crystallization.

11 Claims, 2 Drawing Sheets

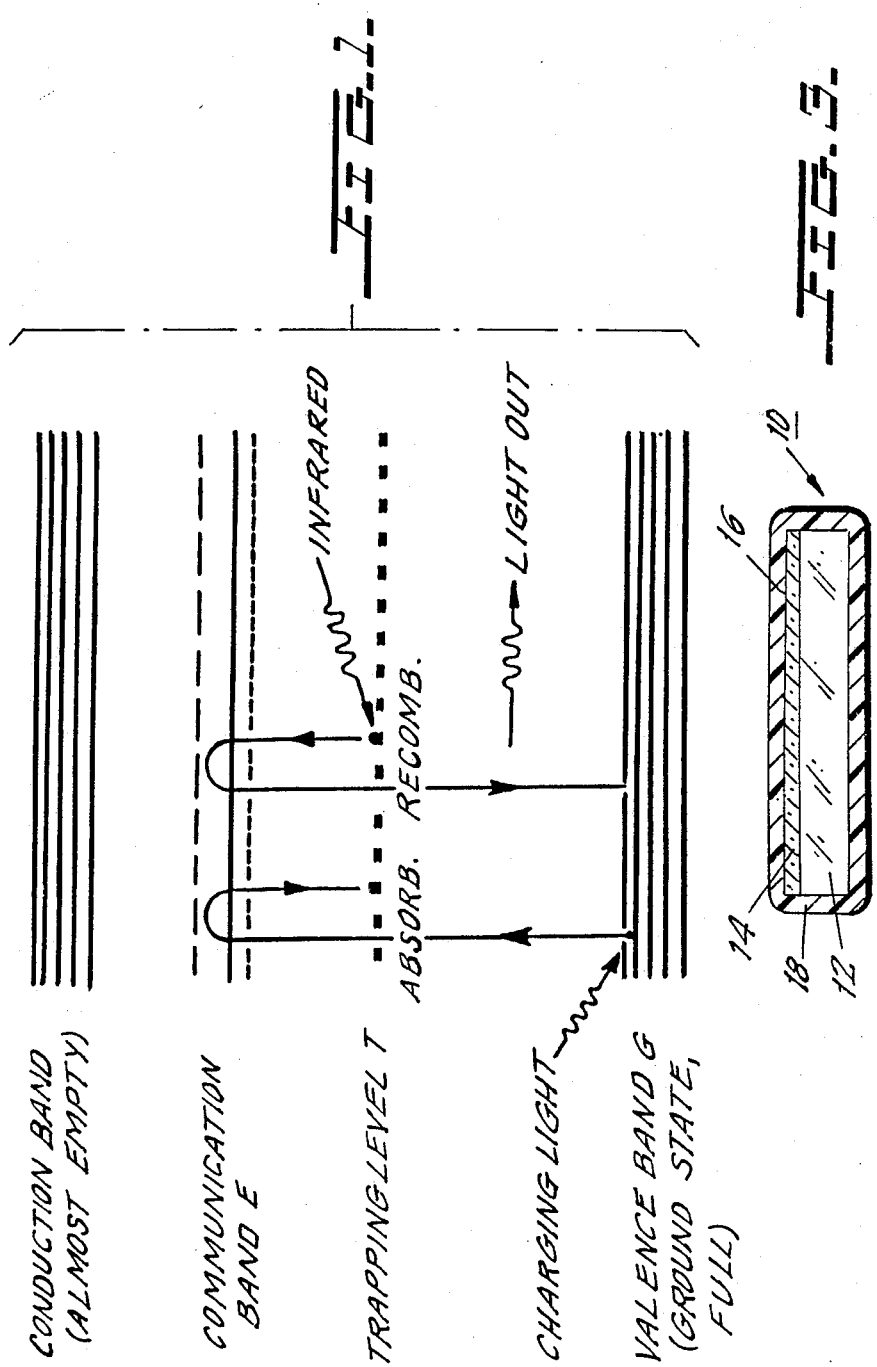

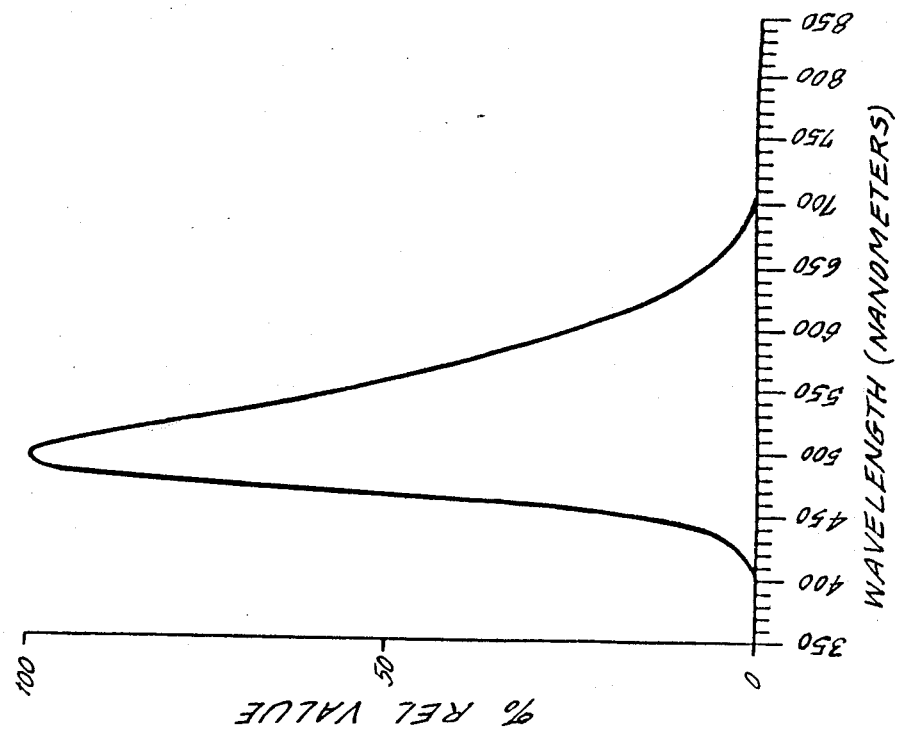
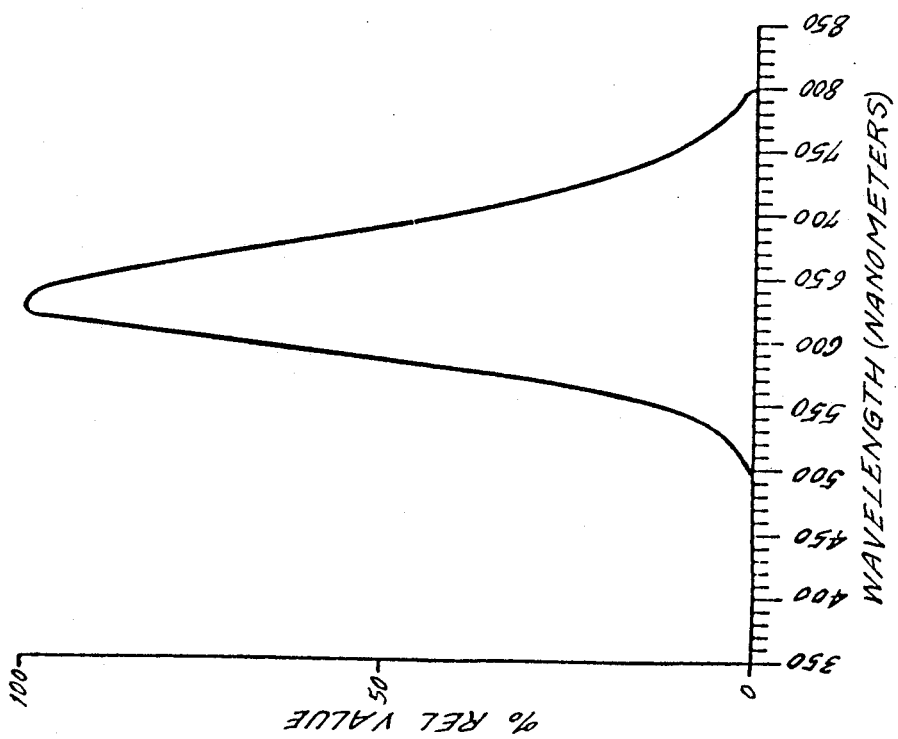

METHOD OF MAKING THIN FILM PHOTOLUMINESCENT ARTICLES

CROSS-REFERENCE TO RELATED APPLICATIONS

This application is a continuation-in-part of U.S. patent applications Ser. No. 870,877, filed June 5, 1986, now U.S. Pat. No. 4,864,536, issued Sep. 5, 1989, and Ser. No. 870,809, filed June 5, 1986, now U.S. Pat. No. 4,830,875, issued May 16, 1989, which are continuations-in-part of U.S. patent application Ser. No. 786,095, filed October 10, 1985, now U.S. Pat. No. 4,705,952, issued Nov. 10, 1987, all three of which applications are assigned to the assignee of this application.

This application is also related to the present inventor's U.S. patent applications Ser. No. 078,829, filed July 28, 1987 now U.S. Pat. No. 4,842,960, issued June 27, 1989; and Ser. No. 085,465, filed August 14, 1987 now U.S. Pat. No 4,812,660, issued Mar. 14, 1989, and Ser. No. 147,215 filed Jan. 22, 1988, now U.S. Pat. No. 4,879,186 assigned to the assignee of this application, all of which applications are hereby incorporated herein by reference.

BACKGROUND OF THE INVENTION

This invention relates to photoluminescent articles made from electron trapping optical material and a process for making such articles.

Materials that contain luminescent centers often include one or more types of centers that trap electrons. Upon application of suitable wavelengths of light, or application of x-rays, or other radiation, the materials produce free electrons which may be trapped in an energy level higher than their ground state. If the "depth" of the trap (that is, the amount of energy required to release the electron from the trap) is large relative to the thermal energy of the ambient temperature, the electron will remain trapped for a long time. Indeed, if the trap is sufficiently deep, the electron will remain trapped almost indefinitely unless the electron is energized by energy from light, other electromagnetic energy, or thermal energy much higher than room temperature.

As used herein, a "photoluminescent material" is a material wherein electrons trapped at high energy levels due to application of optical energy will remain trapped until light or other radiation is applied to provide sufficient energy to the electron to escape from the trap. For such photoluminescent materials, room temperature thermal energy is insufficient to allow any significant portion of trapped electrons to escape from their traps. As used herein, "optical energy" shall include visible light, infrared light, and ultraviolet light unless otherwise noted.

Although various photoluminescent materials have heretofore been known, the properties of such materials have often been less than desirable. For example, photoluminescent materials have been used for locating infrared beams by outputing visible light upon placement of the material within an infrared beam, but such previous photoluminescent materials are not sensitive enough to detect relatively low levels of infrared light, The visible light output by such materials is often at a quite low level such that detection of the visible light is difficult.

Further, such materials commonly have insufficient depth for the electron traps and/or a relatively low density of electron traps such that it is difficult to maintain the electrons trapped for extended periods of time, The ratio of the energy of light input, in order to trap electrons, to energy of light output, by the freeing of the trapped electrons, in such materials in order to trap electrons by the freeing of the trapped electrons is often quite high. That is, a relatively large amount of energy must be put into the material to provide a given output optical energy. The development of photoluminescent materials avoiding or minimizing the disadvantages discussed above would open up numerous other applications for such materials.

Such photoluminescent materials have been contemplated for use as storage media for optical memory systems; however, conventional methods of forming a layer of photoluminescent material on a substrate for optical memory applications have produced a relatively thick layer of material. That thickness inherently promotes dispersion of the write and read beams of light, as well as the dispersion of the escape of electrons. Also, that thickness inherently contributes to a lower response time than is desirable.

Another limitation of prior methods is that they frequently employ a heating step in which the substrate is heated to relatively high temperatures. This limits the types of substrates that may be employed, as low-melting-point substrates tend to deform at such temperatures or react with the photoluminescent material.

A further limitation of certain potoluminescent materials is that they contain lithium fluoride to promote fusability, the fluoride ion in which tends to react with glass substrates.

SUMMARY OF THE INVENTION

It is a principal object of the present invention to provide a photoluminescent article comprising a relatively thin film of photoluminescent material disposed on a substrate.

Another object of the invention is to provide a method of applying the photoluminescent material to the substrate in a thin film.

A further object of the invention is to provide methods for crystallizing the photoluminescent material and growing crystals thereof to a desired size after the material has been deposited on the substrate, some of which methods do not require heating the substrate to a high temperature.

The above and other objects of the present invention which will become more apparent as the description proceeds, are realized, in one preferred embodiment, by first forming the photoluminescent material in bulk, then applying the material in a relatively thin film to a substrate, and then subjecting at least the photoluminescent material to a high temperature for a period of time to effect crystallization of the material, such that the material acquires electron trapping characteristics.

DESCRIPTION OF THE DRAWINGS

The above and other features of the present invention will be more readily understood when the following detailed description is considered in conjunction with the accompanying drawings in which:

FIG. 1 is a schematic illustrating the principle of operation of the present invention.

FIG. 2 shows the spectrum of light output by a first material according to the present invention.

FIG. 3 shows a photoluminescent article according to the present invention.

FIG. 4 shows a spectrum of output light from a second material according to the present invention.

DETAILED DESCRIPTION OF THE PREFERRED EMBODIMENTS

FIG. 1 shows the principles of operation of the photoluminescent material of the present invention. The electron on the left is originally in a valence band G and may be energized by application of a visible charging light to a communication band E. Upon removal of the energizing light, the electron will drop back to a trapping level T. The electron will remain trapped in the trapping level until sufficient additional energy is provided to the electron to move it back up to the communication band E. As shown on the right side of FIG. 1, the electron may be stimulated by infrared electromagnetic energy to move it back to the communication band E for recombination whereupon it may move back to the valence band G and output visible light in the process. The materials of the present invention work upon the principle illustrated by FIG. 1 whereby light may be "stored" by the phenomenon of electron trapping and the light may be freed by application of infrared radiation to push the electron up above the trap and allow it to return to the valence band.

EXAMPLE 1

A photoluminescent material may be made from a mixture having the following composition:

| | |
|---|---|
| Strontium sulfide | 100 parts |
| Barium sulfate | 5.5 parts |
| Lithium fluoride | 5.5 parts |
| Samarium | 150 parts per million |
| Europium oxide | 550 parts per million |

As used above and throughout this application, "part" and "parts per million" shall refer to parts by weight unless otherwise noted.

The mixture is placed into a graphite crucible within a furnace flushed with a dry nitrogen atmosphere (preferably derived from liquid source) or other dry inert atmosphere such as argon, and heated to between 1150 and 1300 degrees Centigrade (preferably about 1200 degrees Centigrade) for about 30 minutes to about 1 hour such that it forms a fused mass. For longer heating times, a fused mass could be formed at temperatures as low as about 950 degrees Centigrade. Temperatures as high as about 2000 degrees Centigrade could be used to form a fused mass in shorter times.

After cooling, the fused mass is ground into a fine powder having a particle size of about 1 to about 10 microns if the material is to be used for optical memory materials. If the material is to be used for an infrared sensing card or for an optical viewing screen, the fused mass is ground to between about 10 and about 100 microns. The particle size could be larger for large screens, which screens would generate visible images form infrared input.

After grinding, the powdered material is heated to about 300 to about 700 degrees Centigrade (preferably about 600 degrees Centigrade) in the graphite crucible within the nitrogen or other inert atmosphere furnace. This second heating is below the fusing temperature of the material (about 700 degrees Centigrade) and is maintained for about 10 to about 60 minutes (preferably about 30 minutes). This second heating removes internal stresses and repairs damage done to the crystalline surfaces of the powdered material during the grinding step.

After the second heating, the powdered material is cooled and the material is then mixed with a suitable binder or vehicle such as acrylic, polyethylene, or other organic polymer.

After the material has been mixed with a transparent binder, it is applied as a coating to plastic, aluminum oxide, glass, paper, or other substrate in order to realize an infrared sensing device or card according to the present invention. The coating of the photoluminescent material upon the substrate will preferably be between about 1 micron and about 500 microns in thickness.

In the above mixture, the strontium sulfide serves as a base material whereas the lithium fluoride is used to provide the fusability characteristic useful for the specific preferred embodiment. Alternatively, other alkaline earth metal sulfides and alkaline earth metal selenides might be used as the base material.

The barium sulfate in the above mixture is used to improve the brightness of output light from the memory material. Preferably about 5.5 parts are used as noted above, but between about 2 and about 10 parts may be used of the barium sulfate as well as between about 2 and about 10 parts of lithium fluoride relative to the 100 parts of strontium sulfide. The barium sulfate is not absolutely essential, but between about 1% and 5% barium sulfate by weight will greatly improve the optical characteristics of the material.

The samarium is used to establish the electron trapping level and the europium oxide is used for establishing the communication band. Preferably about 150 parts per million of samarium are used, but the samarium could alternately be between about 50 parts per million and about 600 parts per million. The europium oxide would preferably be between about 300 and about 800 parts per million and between about 400 and about 600 parts per million are most preferred with about 550 parts per million being the optimal value. Europium fluoride, europium chloride, or europium sulfide could be used in lieu of europium oxide.

The mixture resulting from the above process provides a depth for electron traps of about 1.2 electron volts and has an output spectrum as shown by FIG. 2 which illustrates that the center frequency of the output is approximately 620 nanometers, corresponding to an orange light.

FIG. 3 shows an infrared sensing device 10 according to the present invention. As illustrated, the device lo is of a card (shown in side view) having a substrate 12 and the photoluminescent material applied with a transparent binder at 14 to the substrate 12. The substrate 12 is paper, aluminum oxide, plastic such as PVC, or other material. The material 14 extends along a planar surface 16 perpendicular to the plane of view of FIG. 3. An optional transparent plastic coating 18 may encapsulate the material 14 and substrate 12.

The card of device 10 of FIG. 3 is useful for aligning scientific or industrial instrumentation having infrared beams. In particular, the card 10 may be "charged up" by placement of the photoluminescent material 14 in a strong visible light such that electrons will be trapped. The card 10 may then be placed in from of an infrared light source. The photoluminescent material 14 will output a visible light at the place where the infrared beam strikes the material, thereby allowing the user to identify exactly where the otherwise invisible beam of infrared radiation is located. Accordingly, the card 10 may be used to calibrate scientific or industrial instruments. Advantageously, the material of Example 1 above and other materials discussed in this application provide a relatively high output light upon stimulation by infrared such that the card can be used with some background visible light. That is, the light output is sufficient that he visible light output by the freeing of trapped electrons in the photoluminescent material 14 will be visible despite the background light. A screen for displaying infrared information as visible light patterns can be made by the same process.

EXAMPLE 2

A second photoluminescent material according to the present invention may be made with the following composition:

| | | |
|---|---|---|
| Strontium sulfide | 100 | parts |
| Barium sulfate | 5 | parts |
| Lithium fluoride | 10 | parts |
| Samarium | 100 | parts per million |
| Cerium oxide | 1200 | parts per million |

The above mixture is processed in the same process as Example 1 by first heating it to fusing, grinding the resultant fused mass, and then reheating at below the fusing temperature but sufficiently high to allow repair of damage to the crystalline parts. Cooling may be used after each of the heating and reheating steps. The same process steps in terms of temperature and time intervals may be used in processing this second material. The resulting powder may be ground as with Example 1, combined with a transparent binder or vehicle, and applied to a substrate to realize a card or device for infrared sensing as illustrated by 10 in FIG. 3.

In the above mixture, the barium sulfide may vary between about 2 and about 10 parts, the lithium fluoride may vary between about 2 and about 10 parts, the samarium may vary between about 50 and about 200 parts per million, and the cerium oxide may vary between about 300 and about 1500 parts per million. The specific values for portions which are given above provide highly superior characteristics such as sensitivity. The second material may be charged up very quickly with visible light. The material may hold the charge for extended periods of time similar to the first material and will trigger re-emission of visible light of about 500 nanometers (blue-green light) upon application of an infrared source. The emission spectrum under infrared stimulation is illustrated in FIG. 4.

EXAMPLE 3

A photoluminescent material is made according to the ingredients and the process of Example 2 above except that the mixture is heated for about 2 hours in the fusing step. The output spectrum of this photoluminescent material will be essentially the same as FIG. 4, but this material is different from Example 2 in that the extended fusing step extends the infrared sensitivity to higher wavelengths.

EXAMPLE 4

A photoluminescent material is made having the following composition:

| | | |
|---|---|---|
| Strontium sulfide | 100 | parts |
| Barium sulfate | 5.5 | part |
| Samarium | 150 | parts per million |
| Europium oxide | 550 | parts per million. |

The material of Example 4 may be furnished in an article having a substrate by one of two methods, neither requiring the use of a binder or vehicle.

In the first method, the listed materials are physically deposited (mixed or unmixed) on a suitable substrate, aluminum oxide, for example. The materials and substrate are then placed into a furnace for fusing under the conditions of Example 1 and the materials fuse without the use of the lithium fluoride of Example 1. Because the photoluminescent material bonds so well to the aluminum oxide substrate, the use of separate binders or vehicles is unnecessary.

The structure resulting from the fusing step may optionally be encapsulated in clear plastic to realize the device 10 of FIG. 3. No grinding or reheating is necessary. This method could also be used with the starting materials of Examples 2 or 3 except that lithium fluoride would not be used. The fusing step could be accomplished under the conditions of Example 2 or Example 3. As with Examples 1, 2, and 3, the use of barium sulfate is not absolutely essential bu greatly improves the optical characteristics of the material.

The photoluminescent materials may be used for infrared sensing and/or as a memory by their electron trapping characteristics in crystal form (i.e., the form in Examples 1, 2, and 3 before grinding), powder form (Examples 1, 2, and 3), and amorphous form (Example 4).

The second method of making a photoluminescent article, described in detail below, and one which is much preferred for forming a thin film on a substrate, is to deposit a thin layer of these materials on the substrate and then heat the materials to a selected temperature for a selected time so as to form crystals of suitable size. In addition to the materials cited in Examples 1, 2, and 3, it is also equally applicable to utilize the materials described in my co-pending U.S. patent applications Ser. No. 078,829, filed July 28, 1987 now U.S. Pat. No. 4,842,960; and Ser. No. 085,465, filed August 14, 1987 now U.S. Pat. No. 4,812,660; and Ser. No. 147,215, filed January 22, 1988 now U.S. Pat. No. 4,879,186.

Thin layers can be formed by any of a number of known thin film deposition techniques, such as: physical vapor deposition by boat evaporation in a vacuum system, electron-beam evaporation in a vacuum system, sputtering, vapor deposition (CVD, MOCVD, plasma-assisted CVD, photo-CVD), or ion-beam deposition, or combinations thereof.

Preferably, for some of the above deposition techniques such as the physical vapor deposition techniques, the phosphor material is prepared first in bulk so that its basic characteristics can be established in advance, which is an important factor in quality and cost control. In addition, such preparation allows for outgassing of the source materials, control of undesired oxide formation, incorporation of all components in the desired ratios and shaping of the desired deposition sources.

It has been found that electron-beam (EB) evaporation in a vacuum system produces a satisfactory film on the order of about 2 to about 4 microns in thickness. Sputtering can produce a satisfactory film about 1 micron in thickness which is close to the preferred crystal diameter of 3000 Angstroms or 0.3 micron.

To make an EB source or sputtering target, it has been found preferable to mix the base material and the proper ratios of dopants in a closed ball mill with a liquid, such as isopropanol, for about 5 hours. The material is dried in air or, preferably, dry nitrogen at temperatures from room temperature up to about 50 degrees Centigrade to drive off the alcohol, then forced through a screen (of approximately 40-mesh) to break up any undried clumps.

The dry powder is then pressed in a die at about 4000 pounds-per-square-inch to compact the material and force out entrapped gasses. Following this, the compacted material is heated to about 1200 degrees Centigrade, with the furnace flushed with a very dry, inert gas, such as nitrogen from a liquid source. Preferably, the furnace is heated to temperature at a controlled rate of about 200 Centigrade degrees per hour to allow for the gradual escape of gas, which procedure results in desired higher quality. The furnace is held at temperature for from about 1 to about 6 hours depending on the material, the furnace temperature, and the size of the pressed piece, typically for about 3 hours at about 1200 degrees Centigrade. Then the material is cooled to ambient temperature, preferably with controlled cooling at the rate of about 200 Centigrade degrees per hour. The resulting solid piece is tested with an infrared light to ensure that it will perform satisfactorily before utilization for deposition. For electron-beam deposition, the target is typically about 1-inch diameter by about $\frac{1}{2}$-inch thick. For sputtering, the target is typically about 3-inch (or larger) diameter by about $\frac{1}{4}$-inch thick.

The crystallization process during or subsequent to deposition of the layer is critical to producing a satisfactory electron trapping material. If the phosphor composition is merely deposited on a cold surface without heating, the film consists of microcrystallites on the order of about 300 Angstroms in size. In this state, the material usually has a dark, shiny color such as black or walnut and exhibits no electron trapping function or any other useful optical function. However, upon heating to a temperature range of, say, 500-900 degrees Centigrade, relatively large crystallites are formed by the merging of smaller crystals to a preferred size on the order of about 3000 Angstroms. Following this heat treatment, the film becomes "alive" and will trap electrons and respond to infrared radiation, as described above.

In this state, the material made from the mixture composition of Example 1 tends to absorb blue-green light and reflect orange light, therefore giving it the appearance of orange or light pink. In a preferred condition, the material is largely transparent in visual appearance.

The crystallization must take place in a very dry atmosphere, such as the dry nitrogen atmosphere described above, in order to avoid major oxidation of the film materials. Lower temperatures, when such will promote crystallization of the phosphor material used, will, of course, increase the types of substrate materials that are acceptable. Crystallization temperatures may range from about 40 degrees Centigrade to about 2000 degrees Centigrade.

Any of a number of known materials having suitable properties may be used for the substrate. Some examples of substrates that may be useful in various photonic applications and in optical memories are: sapphire, alumina, other ceramics, quartz, fiber optic faceplates, other glasses, metals such as aluminum, high-temperature polymers, and polycarbonates. Fiber optic faceplates are sold, for example, by Galileo, Schott, and Incom.

In general, the foregoing substrate examples have been arranged so that, as one proceeds through the list, there are increasing difficulties in controlling the quality of the electron trapping phosphor, primarily because of temperature effects on the substrate. The advantage of sapphire and alumina is that there is no detrimental interaction with the phosphor, and the crystallization temperature can be 1000 degrees Centigrade or more without affecting the substrate. Glasses can range from quartz to low melting point glasses. Obviously, the melting or softening point of the substrate cannot be so low that, when exposed to the crystallization temperatures, the substrate deforms. In addition, there is more interaction between the glasses and the phosphor material than with aluminum oxide. The latter factor means that it is some what more difficult to establish a high performance thin film phosphor on a glass substrate. Preferable glass substrates include borosilicates and alumina silicates.

In some cases, optimization can be enhanced by the introduction of an intervening layer between the thin film phosphor material and the substrate. For example, if a metal substrate is first coated with a thin layer of aluminum oxide, the layer will tend to separate undesirable interaction between the metal and the phosphor material (and will also help to keep the temperature of the phosphor higher when certain crystallization methods are used which are intended to primarily heat only the phosphor, such as flash heating). While aluminum oxide is the preferred interlayer, some others which may be used include oxides of tantalum and zirconium. Interlayers may also be formed in situ by treating the surface of the substrate. For example, an aluminum substrate can be oxidized thermally or anodically to form an aluminum oxide layer upon which the thin film of phosphor material would subsequently be deposited.

The techniques of crystallization and the substrate material are interrelated. In the extreme case of a high temperature, non-interactive substrate, crystallization is relatively straightforward because there are no great restraints concerning temperature and time. If a lower temperature substrate is chosen, it is desirable to achieve a temperature gradient across the phosphor-substrate layers so that the phosphor layer is at the highest temperature and the substrate is not fully heated. Accordingly where there are no such restraints concerning temperature and time, crystallization in a furnace, crystallization by resistance heating on a belt, or in-situ crystallization during deposition on a heated substrate are some of a number of methods that may be considered.

On the other hand, if temperature and time are restraints, one may consider using shallow absorption of light from high intensity lamps (hereafter referred to as "photo crystallization"), crystallization by laser scanning, pulsed electron-beam crystallization, and microwave heating. One may also employ other methods, provided that they provide sufficient heat or energy while not exceeding the temperature gradient restraints. For photo crystallization, the lamps that may be employed include xenon flash tubes and tungsten halogen lamps, provided that they have quartz envelopes to withstand the heat. The use of an interlayer will also help to establish a temperature differential between the phosphor and the substrate.

Spire Corporation, Bedford MA, for example, has developed equipment for large-area pulsed electron-beam crystallization for silicon wafers, and Motorola, Inc., of Phoenix Ariz., has worked on laser spot-scanning for recrystallization of silicon ribbons. Some techniques, and considerations of parameters, for laser crystallization and electron-beam crystallization are discussed in "Laser and Electron-Beam Solid Interactions and Materials Processing", J. F. Gibbons, L. D. Hess, and T. W. Sigmon, editors, published by Elsevier North Holland, Inc., New York N.Y., copyright 1981, which volume and the references cited therein are hereby made a part hereof by reference.

While typical crystallization conditions are on the order of about 30 seconds at about 800 degrees Centigrade for certain substrates, ranges of conditions which have been found to produce recrystallization of the phosphor film materials described above are:

| Substrate | Time and Temperature |
|---|---|
| Alumina | about 5 minutes @ about 600 degrees Centigrade to about 1 minute @ about 800 degrees Centigrade |
| Sapphire | about 5 minutes @ about 600 degrees Centigrade to about 15 seconds @ about 900 degrees Centigrade |
| Fiber Optic Faceplate | about 2 minutes @ about 400 degrees Centigrade to about 15 seconds @ about 600 degrees Centigrade. |

In general, the time and temperature depend, in part, on how soon the film material reaches its nucleation point, at which point, the crystals rapidly grow to a satisfactory size. Therefore, the point of import is that the film itself reach the necessary recrystallization conditions, which could likely be 900 degrees Centigrade for a fraction of a second to a longer period for 400 degrees Centigrade. In order to achieve optimum results, it is preferable to either absorb energy only in the film for a short duration, without having to bring the substrate up to the recrystallization temperature, or else to have a substrate fully compatible with the temperature excursion An additional advantage of photo-crystallization as a technique for these thin films is that they are quite absorbing optically as deposited and become quite optically transparent upon completion of crystallization. Thus, the photo-crystallization technique has an inherent self-limiting of the energy absorption process as the crystallization is completed, helping to assure minimum temperature rise of the substrate.

In some cases, it may be desirable to provide an optical overcoat on the thin phosphor layer to improve performance. Since the optical overcoat would normally be deposited on the already crystallized phosphor layer, the selection of that overcoat is less critical than in the case of selecting an interlayer material. Optical overcoating can be used to enhance light coupling at different wavelengths, reduce surface recombination of the trapped electrons, and/or serve as a protective layer against ambient conditions. The index of refraction is an important consideration in optical matching and, since the phosphors have indexes of refraction typically in the range of 2.1 to 2.5, aluminum oxide, silicon oxide, and magnesium fluoride may display desirable optical properties. Ideally, the refractive index of the overcoat(s) should lie between the refractive index of the phosphors and that of air to produce, for example, quarter-wave antireflection coatings.

It can thus be seen that an article having a thin film of photoluminescent material produced according to the present invention is especially useful in high-resolution optical memory or image processing applications, among others, as the thinness of the film decreases the tendency for dispersion of the write and read optical beams and of the released light, as compared to powder films.

Although various specific details have been discussed herein, it is to be understood that these are for illustrative purposes only. Various modifications and adaptations will be apparent to those skilled in the art. Accordingly, the scope of the present invention should be determined by reference to the claims appended hereto.

What is claimed is:

1. A process for preparing a photoluminescent article, comprising the steps of:
    mixing,
        a base material selected from the group of alkaline earth metal sulfides and mixtures thereof,
        a first dopant for establishing a election trapping level, and
        a second dopant for establishing an communication ban for luminescence;
    depositing the mixture in a thickness on the order of microns such a non-interactive substrate using a vapor deposition technique; and
    heating the mixture and substrate to a temperature at which crystallization of said mixture occurs without degrading the integrity of the substrate, to form a continuous thin film electron trapping storage type photoluminescent article.

2. A process as recited in claim 1, further comprising the step of providing an interlayer upon said substrate before said step of depositing said selected material.

3. A process as recited in claim 1, further comprising the step of providing an overcoat upon said material after said step of crystallization.

4. A process as recited in claim 1, wherein said temperature is in the range of about 400 to about 2000 degrees Centigrade.

5. A process as recited in claim 1, wherein said time is from about 15 seconds to about 5 minutes.

6. A process as recited in claim 1, wherein the thickness of said photoluminescent material upon said substrate is about 1 micron.

7. A process as recited in claim 1 wherein the thickness of said photoluminescent material upon said substrate is about 1 micron to about 4 microns.

8. A process as recited in claim 1, wherein said first dopant consists of about 50 to about 600 parts per million samarium; and
    said second dopant is a material selected from the group consisting of europium oxide, europium fluoride, europium sulfide, and cerium oxide.

9. A process as recited in claim 8, wherein said second dopant consists of about 300 to about 800 parts per million of a material selected from the group consisting of europium oxide, europium fluoride, and europium sulfide.

10. A process as recited in claim 8, wherein said second dopant consists of about 300 to about 1500 parts per million cerium oxide.

11. A process for preparing a photoluminescent article as recited in claim 1, wherein said step of mixing further comprises the mixing of lithium fluoride with the base material and the first and second dopants.

* * * * *